INVENTORS,
REYMOND J. KIRCHER,
MERLIN C. WAGER
BY Harold L Jackson
ATTORNEY

INVENTORS,
REYMOND J. KIRCHER,
MERLIN C. WAGER
BY Harold L Jackson
ATTORNEY

INVENTORS,
REYMOND J. KIRCHER,
MERLIN C. WAGER
BY Harold L. Jackson
ATTORNEY

United States Patent Office 2,972,120
Patented Feb. 14, 1961

2,972,120

VARIABLE-FREQUENCY CRYSTAL-CONTROLLED OSCILLATOR SYSTEMS

Reymond J. Kircher, Los Angeles, and Merlin C. Wager, Culver City, Calif., assignors to Hughes Aircraft Company, Culver City, Calif., a corporation of Delaware Filed Oct. 15, 1957, Ser. No. 690,239

5 Claims. (Cl. 332—26)

The present invention relates to crystal-controlled oscillator systems, and more particularly to a means for varying the frequency of such a system in accordance with a control signal.

In the past, the oscillation frequency of crystal-controlled oscillators has been varied by several methods, one of which includes the use of current-controlled variable inductance devices having ferrite cores connected in series with the crystal that stabilizes the oscillation frequency of oscillator circuits to vary the oscillation frequency in accordance with the current flow through one or more windings on the ferrite cores. Also, reactance tube circuits have been employed to vary the frequency of oscillations of various types of crystal-controlled oscillators. These prior art circuits have several disadvantages including instability of the oscillation frequency with ambient temperature changes and supply voltage variations. Furthermore, it has been difficult in the past to linearly vary the frequency of oscillations of a crystal-controlled oscillator with a control voltage.

The present invention is based on the discovery that the frequency of oscillations of a crystal-controlled oscillator may be varied by connecting reactive means such as a capacitor in series relationship with the crystal that is utilized to stabilize the oscillator and placing a control transistor in parallel with this capacitor. By appropriately coupling the base and collector electrodes of such a control transistor across this capacitor, the effective reactance across the capacitor can be made to vary with current flow through the control transistor which in turn varies the resonant frequency of the series combination of the capacitor and crystal and thereby varies the oscillation frequency of the oscillator. This arrangement advantageously utilizes the characteristics of transistors which are dependent upon their emitter current and collector voltage. The interactions of these characteristics which include the changes of alpha (short-circuit current amplification factor) and collector conductance with emitter current and the changes of collector capacitance with collector voltage, are not completely understood at this time. However, it has been found that the combination of these characteristics affects the reactance of the series combination of the capacitor and crystal stabilizing element to provide a linear variation of the oscillator frequency with respect to the amplitude of a control voltage applied across the base and emitter electrodes of the control transistor. It has further been discovered that the use of such a control transistor aids in stabilizing the overall oscillator system with respect to changes in ambient temperature and supply voltage.

It is an object of the present invention to provide an improved oscillator system wherein the frequency of a crystal-controlled oscillator is varied in accordance with a control voltage applied to a control transistor.

It is another object of the present invention to provide an electronic means for linearly varying the frequency of a crystal-controlled oscillator so that the frequency of oscillation is substantially independent of operating condition variations such as ambient temperature and supply voltage variation.

Accordingly, the present invention provides a variable-frequency crystal-controlled oscillator system in which the frequency of an oscillator circuit having a crystal for stabilizing the frequency of oscillation and reactive means connected in series relationship with the crystal is controlled by means of a control transistor having its base and collector electrodes coupled across the reactive means whereby the oscillation frequency of the system may be controlled by applying a control voltage across the base and emitter electrodes of the control transistor.

The novel features which are believed to be characteristic of the invention both as to its organization and method of operation, together with the further objects and advantages thereof, will be better understood from the following description considered in connection with the accompanying drawings in which.

Figure 1:
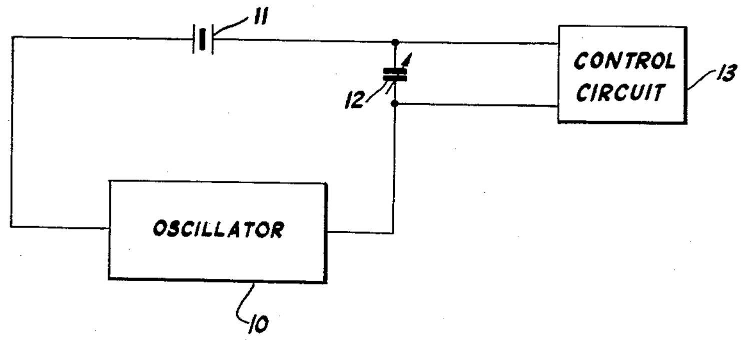
Fig. 1 is a block diagram of one embodiment of the present invention.
Figure 2:
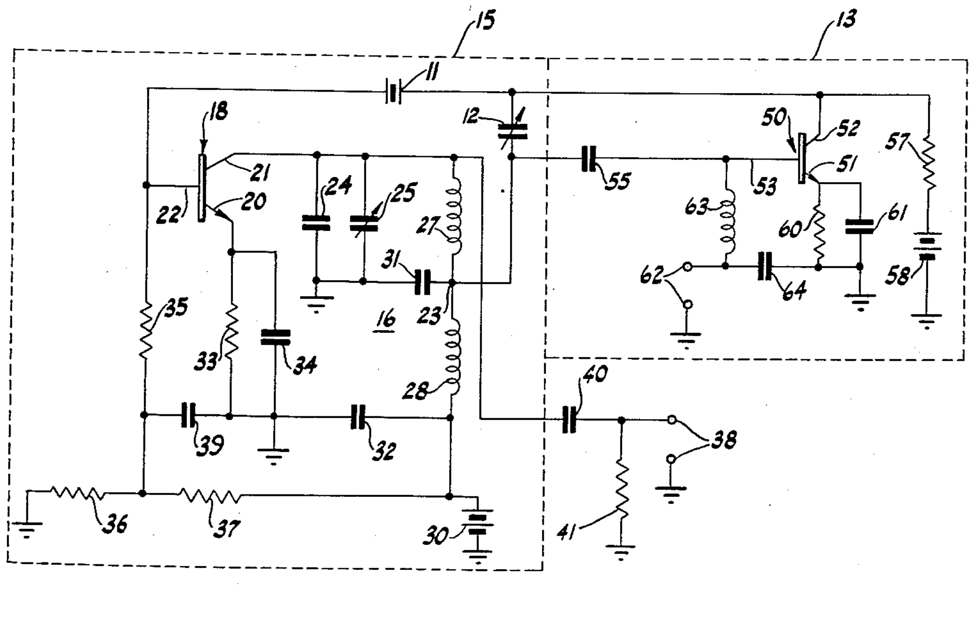
Fig. 2 is a schematic circuit diagram of an oscillator system utilizing the principles of the present invention.
Figure 6:
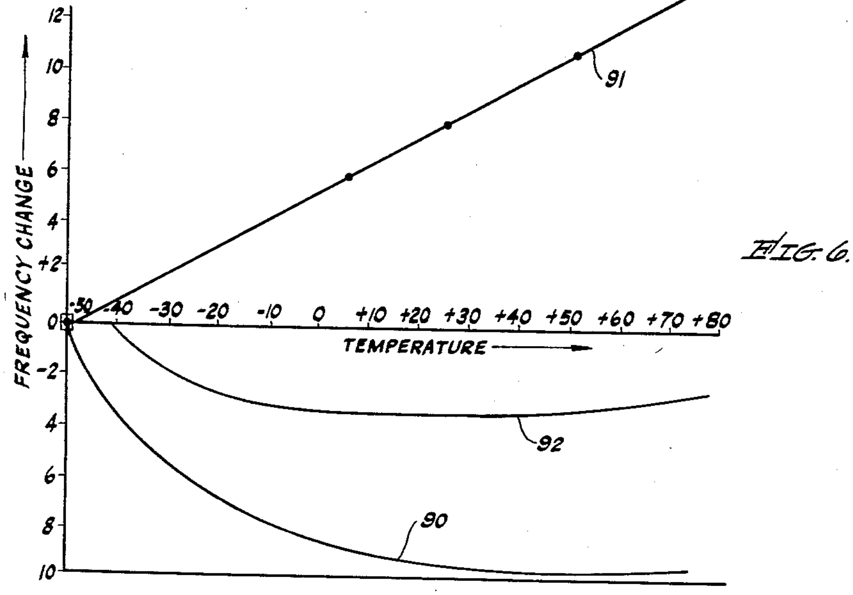
Figure 7:
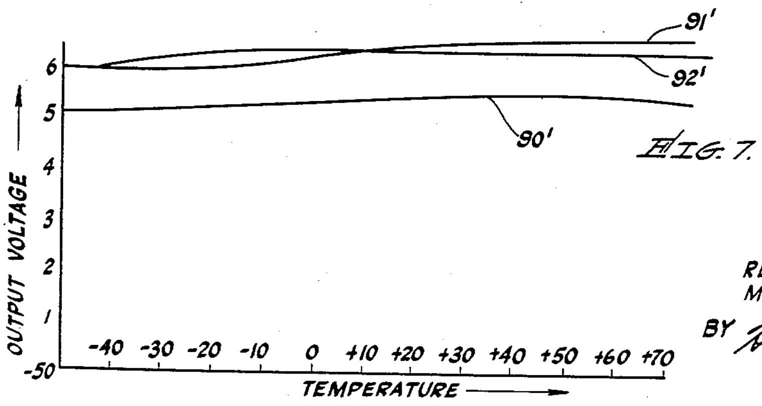

Fig. 6 is a graph illustrating the frequency deviation of the oscillation frequency of the circuit of Fig. 2 with respect to changes in ambient temperature and different values of the capacitor connected in series with the crystal control element; and Fig. 7 is a graph illustrating the output voltage variation from the circuit of Fig. 1 with respect to ambient temperature change and different values for the capacitor connected in series with the crystal control element.

Referring now to the drawings, and more particularly to Fig. 1, an oscillator 10 which may be of the regenerative feedback type, is provided with a frequency stabilizing crystal control element 11 and an adjustable frequency determining capacitor 12 connected in series relationship. Where the oscillator 10 is of the regenerative feedback type, the crystal 11 and the capacitor 12 form the regenerative feedback path and serve as a series resonant circuit to control the frequency of oscillation of the oscillator 10, as is well known in the art. The crystal 11 may be composed of quartz or any other suitable piezoelectric material which exhibits a relatively low impedance at a predetermined frequency and a higher impedance at frequencies above and below this predetermined frequency. Changes in the reactance of the capacitor 12 result in changing the resonant frequency of the combined crystal element 11 and the capacitor 12 and this, in turn, results in a change in the frequency of oscillation of the oscillator 10. To electronically control the value of the reactance of the series combination of the crystal 11 and the capacitor 12, a control circuit 13 is connected across the capacitor 12. Thus, the control circuit performs the function of changing the reactance across the capacitor 12 and thereby controls the frequency of oscillation of the oscillator 10.

Referring now to Fig. 2, there is disclosed a preferred embodiment of the present invention in which an oscillator circuit 15 of the regenerative feedback type is controlled by the control circuit 13. The oscillator 15 resembles somewhat a Hartley-type oscillator, having a regenerative feedback path which includes the crystal 11 and the capacitor 12 connected in series between a parallel resonant tank circuit 16 and the input circuit to the active element of the oscillator which is illustrated as an oscillator transistor 18.

The transistor 18 is shown as an NPN junction transistor and includes an emitter electrode 20, a collector electrode 21 and a base electrode 22. The tank circuit 16 is connected in the collector-emitter circuit of this transistor and the regenerative feedback path which includes the crystal 11 and the capacitor 12 is connected between a point 23 in this tank circuit and the base electrode 22. As is shown, the tank circuit comprises a pair of capacitors 24 and 25 connected in parallel between the collector electrode 21 and ground, the capacitor 25 being adjustable to permit tuning of the tank circuit 16. Two inductors 27 and 28 are also included in the tank circuit and are connected in series between the collector 21 and the positive terminal of a suitable source of energizing potential such as a battery 30. Another capacitor 31 is connected between the junction of the inductors 27 and 28 or the point 23 and ground. A by-pass capacitor 32 is connected between the positive terminal of the battery 30 and ground. The emitter circuit of the transistor 18 includes an emitter resistor 33 and a by-pass capacitor 34 connected in parallel between the emitter 20 and ground. The by-pass capacitor 34 provides a low impedance for the alternating-current signals appearing at the emitter 20. A base bias resistor 35 is connected between the base 22 and the junction point of a pair of voltage divider resistors 36 and 37, the resistors 36 and 37 being connected in series between the positive terminal of the battery 30 and ground. A decoupling capacitor 39 is connected between the junction of the resistors 35, 36, 37 and ground. A pair of output terminals 38, one of which is connected to ground, and the other being connected to the collector 21 by means of a coupling capacitor 40, are provided for deriving an output signal from the oscillator 15. A load resistor 41 is connected across the output terminals 38. The tank circuit 16 may be tuned to the resonant frequency of the series connected crystal 11 and capacitor 12 to provide an initial oscillation frequency equal to the resonant frequency of the feedback path.

A control transistor 50 of the NPN junction variety, including an emitter electrode 51, a collector electrode 52 and a base electrode 53, is provided to change the resonant frequency of the feedback circuit or to shift the phase of the signal fed back to the base electrode 22 and thereby control the frequency of oscillation of the oscillator 15. The base and collector electrodes of the control transistor 50 are coupled in parallel with the capacitor 12 to change or vary the reactance of the regenerative feedback path in accordance with the current flow through this control transistor. As is shown, the collector electrode 52 is connected to the junction of the crystal 11 and the capacitor 12 and the base electrode 53 is connected to the other terminal of the capacitor 12 or to the point 23 by means of a coupling capacitor 55. Operating bias is provided for the collector electrode 52 by means of a collector resistor 57 and a battery 58, the positive terminal thereof being connected to the resistor 57 and the negative terminal being connected to ground. While two separate batteries 58 and 30 are illustrated for supplying the operating bias to the transistors 18 and 50, only one such battery need be utilized, in which case the resistor 57 would be connected to the battery 30. As is shown, the resistor 57 is connected between the collector 52 and the positive terminal of the battery 58, the negative terminal thereof being grounded. The emitter 51 is connected to ground by means of an emitter resistor 60 and a by-pass capacitor 61 connected in parallel between the emitter 51 and ground. A pair of input terminals 62 for supplying a control voltage to the transistor 50 are placed between the base electrode 53 and ground, one of the input terminals 62 being connected to the base electrode 53 through a suitable radio frequency isolation inductor 63 and the other of the input terminals being connected to ground. A decoupling capacitor 64 is connected between the non-grounded terminal of the input terminal 62 and ground.

By suitably arranging the battery potential, either or both of the transistors 18 and 50 may be replaced with junction transistors of the PNP type.

In operation, the tank circuit 16 and the capacitor 12 are adjusted to provide the desired initial oscillation frequency of the oscillator 15 which may, for example, be 100 kilocycles, and also the desired frequency operating range. The value of the capacitor 12 determines, to a large extent, the range of frequencies that may be controlled by the control circuit 13. This is best seen by referring to Fig. 3 in which the ordinate represents the frequency deviation of the oscillator 15 and the abscissa represents the control voltage in volts that is applied across the input terminals 62.

Figures 3, 4:
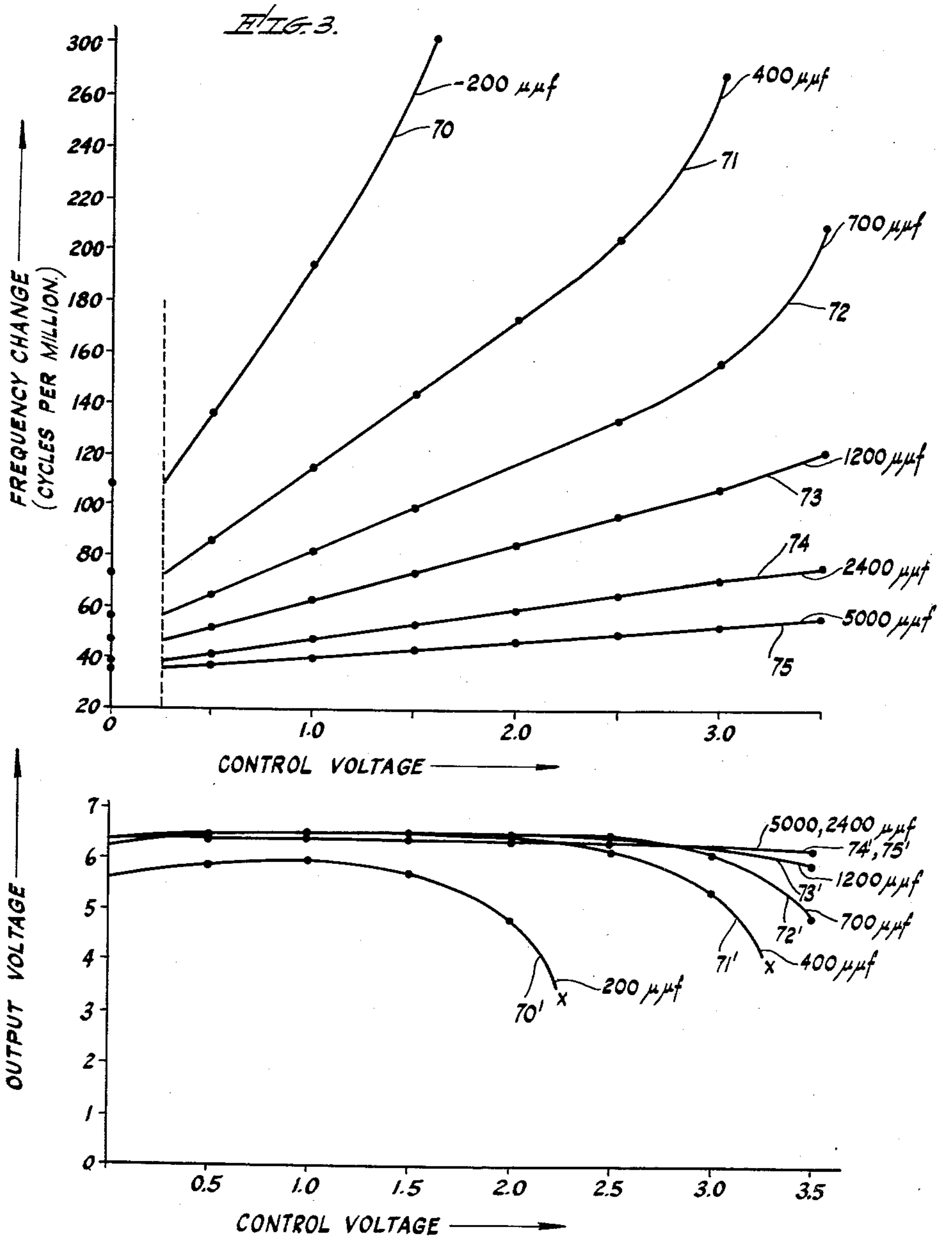
Fig. 3 is a graph illustrating the oscillation frequency for various control voltages and for different values of the capacitor that is connected in series with the crystal control element.
Fig. 4 is a graph illustrating the variation of the amplitude of the output voltage from the oscillator of Fig. 2 for various control voltages and for different values of the capacitor connected in series with the crystal.

Referring to Fig. 3, the curve 70 represents the frequency deviation of the oscillator 15 with the capacitance of the capacitor 12 being equal to 200 micro-microfarads. The curves 71, 72, 73, 74 and 75 represent the frequency deviation, with the values of the capacitance of the element 12 being 400, 700, 1200, 2400 and 5000 micro-microfarads, respectively, as indicated in Fig. 3.

It is observed from Fig. 3 that the oscillation frequency can be varied over the largest range of frequencies by utilizing a relatively small capacitor 12 in series with the crystal element 11 (curve 70). However, as this figure also illustrates, the most linear control of the oscillation frequency is effected by the use of a relatively large capacitor in series with the crystal element 11 (curve 75).

Once the capacitor 12 has been adjusted to the desired value, the frequency of the oscillator 15 is varied by applying a positive direct-current voltage across the input terminals 62, which biases the base-emitter junction of the control transistor 50 in the forward direction and renders this transistor conducting. As stated previously, the current flow through the control transistor changes the effective reactance across the capacitor 12 and thereby changes the resonant frequency of the series combination of the capacitor 12 and crystal 11. This in turn changes the phase of the voltage fed back to the base electrode of the oscillator transistor from the tank circuit 16 and results in a change of the oscillation frequency. This control voltage may vary between a few tenths of a volt (sufficient to render the control transistor conducting) and approximately four volts positive with respect to ground, as is indicated in Fig. 3. The range of control voltage required to obtain a desired frequency variation is, however, also dependent upon the value of the emitter resistor 60. With the value of the resistor 60 approximately equal to or greater than 10,000 ohms, the input voltage to the terminals 62 may vary between zero and four volts to provide a linear variation of the oscillation frequency with respect to the amplitude of the control signal.

While the control circuit 13 provides a linear variation of the oscillation frequency of the oscillator 15, with respect to the amplitude of the control voltage applied to the terminals 62, this control circuit has little effect on the amplitude of the output signal at the terminals 38 and even further stabilizes the operation of the oscillator 15 with respect to changes in the ambient temperature and supply voltage to the transistors 18 and 50 relative to the stabilization without the control circuit 13 being connected to the oscillator.

To observe the effect of the control circuit on the oscillator output voltage, reference is made to Fig. 4 in which the ordinate represents the output voltage and the abscissa represents the applied control voltage. The curves 70', 71', 72', 73', 74' and 75' represent the variation in the output voltage with respect to applied control voltages for values of the capacitance of the capacitor 12 equal to 200, 400, 700, 1200, 2400 and 5000 micro-microfarads respectively, as indicated.

Figure 5:
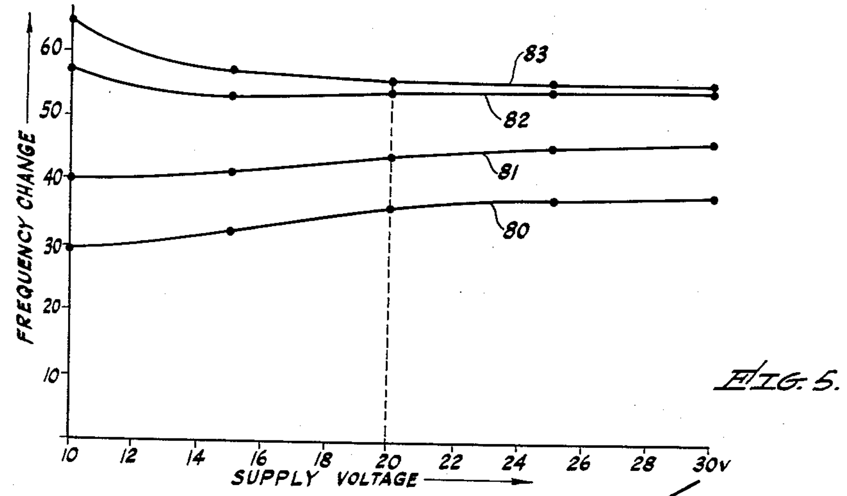
Fig. 5 is a graph illustrating the frequency deviation of the oscillator of Fig. 2 for different direct-current supply voltages to this oscillator circuit and for different control voltages.

Referring now to Fig. 5, wherein the ordinate represents frequency deviation of the oscillator 15 in parts per million and the abscissa represents the direct-current supply voltage, it is observed that the oscillation frequency varies little with large changes in the direct-current supply potential. Several curves are shown in this figure to illustrate the frequency deviation with various supply voltages for the transistors 18 and 50 and different control voltages applied to the terminals 62. The curves 80, 81, 82 and 83 represent the frequency deviation in the oscillation frequency in the oscillator 15, with the control voltage applied to the terminal 62 equal to zero, +1 volt, +1.7 volts and +2 volts, respectively. It is observed in the curve 82 that the frequency deviation for an applied control voltage of +1.7 volts is less than four parts per million for a supply voltage variation of approximately 20 volts.

Fig. 6 illustrates the temperature stability of the oscillation system of the present invention in which the ordinate represents frequency deviation in parts per million and the abscissa represents temperature in degrees centigrade. It is to be noted that the crystal control element 11 remained at a constant room temperature of approximately 26° C. during these temperature stability tests of the oscillator system of Fig. 2. The curve 90 represents the temperature deviation of the oscillator circuit 15 per se. In this particular instance, the control circuit was disconnected and the value of the capacitance of the capacitor 12 was equal to 390 micro-microfarads. Curve 91 represents the frequency deviation of the oscillator system including the control circuit 13 and keeping the same value for the capacitor 12, that is, 390 micro-microfarads. The curve 92 was taken under the same conditions as was curve 91 except that the value of the capacitor was increased to 2400 micro-microfarads. It is to be noted on the curve 92 that the frequency deviation for a temperature range from −25° C. to +75° C. was less than one part per million.

The curves of Fig. 7 illustrate the deviation of the output voltage from the oscillator 15 with respect to changes in the temperature of the transistor control circuit and/or the oscillator circuit with the ordinate representing the output voltage (root mean squared) and the abscissa representing temperature in degrees centigrade. The curve 90' represents the output voltage deviation of the oscillator 15 with the transistor control circuit disconnected from the capacitor 12. The curve 91' represents the output voltage variation with the control circuit connected to the oscillator and with the capacitance of the capacitor 12 being equal to 390 micro-microfarads. The curve 92' represents the output voltage variation with both the oscillator and control circuits connected and the value of the capacitance of the capacitor 12 being equal to 2400 micro-microfarads.

While it is understood that the circuit specifications of the variable-frequency crystal-controlled oscillator system of the present invention may vary according to the desired design for any particular application, the following circuit specifications for the circuit of Fig. 2 to provide a nominal oscillation frequency of approximately 100,000 cycles are included by way of example only:

| | |
|---|---|
| Transistors 18 and 50 | Type 904A, manufactured by the Texas Instrument Company. |
| Batteries 30 and 38 | +20 volt. |
| Inductors 27 and 28 | Type NCR-50-1, 10 millihenrys, three section choke, the element 27 comprising two sections or approximately 6.7 millihenrys and the element 28 comprising one section or 3.3 millihenrys. |
| Inductor 63 | 2.5 millihenrys, type R50 manufactured by the National Manufacturing Company. |
| Resistors 33, 35, 36, 41 and 60 | 10,000 ohms. |
| Resistor 37 | 12,000 ohms. |
| Resistor 57 | 56,000 ohms. |
| Capacitors 32, 34, 35, 38, 55, 61 and 64 | .1 microfarad. |
| Capacitor 24 | 600 micro-microfarads. |
| Capacitor 25 | 7–45 micro-microfarads, trimmer capacitor. |
| Capacitor 31 | 0.45 microfarad. |
| Capacitor 12 | May vary between 200 and 5,000 micro-microfarads as has been indicated before. |
| Capacitor 40 | .01 microfarad. |
| Crystal 11 | Quartz crystal having a resonant frequency of 100 kilocycles, type BH9A, X+5° cut, manufactured by the Bliley Company. |

It is to be understood that while the frequency determining element 12 has been illustrated as a capacitor per se, other reactive components could be utilized as this frequency determining element. Such reactive components as an inductor, per se, or a group of capacitors, inductors and resistors constituting a more complex two terminal network could be connected in series with the crystal 11 so that the transmission properties of the two terminal network determine the frequency of oscillation of the crystal-controlled oscillator. These transmission properties would be altered or changed by the action of the control bias voltage on the control transistor 50 thereby varying the frequency of oscillation.

There has thus been disclosed a variable-frequency crystal-controlled oscillator system which provides a linear variation of the oscillation frequency with respect to the amplitude of an applied control voltage and which is relatively independent of ambient temperature and supply voltage variations.

What is claimed is:

1. A variable-frequency crystal-controlled oscillator system comprising: an oscillator circuit of the regenerative feedback type including a piezoelectric crystal and a first capacitor connected in series relationship in said oscillator circuit to control the frequency of oscillaton, said first capacitor having two terminals; a control transistor having base, emitter and collector electrodes; a second capacitor connected between one of said terminals and said base electrode, said collector being directly connected to the other of said terminals; and means for applying a control voltage across said base and emitter electrodes to control the frequency of oscillation.

2. A variable-frequency crystal-controlled oscillator system comprising: an oscillator circuit including a first transistor having base, emitter and collector electrodes; a parallel resonant circuit connected between the collector and emitter electrodes of said first transistor; a current feedback path of relatively low impedance at a predetermined frequency coupled between said parallel resonant circuit and the base electrode of said first transistor for stabilizing the frequency of oscillation of said oscillator system, said path including a series combination of a piezoelectric crystal and a reactive means; a second transistor having base, emitter and collector electrodes; circuit means coupling the base and collector electrodes of said second transistor across said reactive means; and means coupled to the base and emitter electrodes of said second transistor for applying a control voltage thereacross to vary the current flow through said second transistor and thereby vary the oscillation frequency of said oscillator system.

3. The system as defined in claim 2 wherein said circuit means includes a capacitor, said capacitor being connected between the base electrode of said second transistor and said reactive means, and said first and second transistors are junction transistors of like conductivity types.

4. A variable-frequency crystal-controlled oscillator system comprising: an oscillator circuit of the regenerative feedback type including a piezoelectric crystal and a first capacitor connected in series relationship in said oscillator circuit to control the frequency of oscillation, said capacitor having a first and a second terminal, said first terminal being connected to said piezoelectric crystal; a control transistor having base, emitter and collector electrodes; a second capacitor connected between said second terminal and said base electrode, said collector electrode being directly connected to said first terminal; a pair of input terminals; an inductive means connected between one of said input terminals and said base electrode; and circuit means connected between said emitter electrode and the other of said input terminals, whereby the frequency of oscillation of said oscillator circuit may be varied by varying the direct-current voltage applied across said input terminals.

5. A variable-frequency crystal-controlled oscillator system comprising: an oscillator circuit including a first transistor having base, emitter and collector electrodes;

a parallel resonant circuit connected between the collector and emitter electrodes of said first transistor; a current feedback path of relatively low impedance at a predetermined frequency coupled between said parallel resonant circuit and the base electrode of said first transistor for stabilizing the frequency of oscillation of said oscillator system, said path including a series combination of a piezoelectric crystal and a first capacitor, said first capacitor having first and second terminals, said first terminal being connected to said crystal; a second capacitor connected between said second terminal and the base electrode of said second transistor, the collector electrode of said second transistor being directly connected to a pair of input terminals; an inductor connected between the base electrode of said second transistor and one of said input terminals; impedance means connected between the emitter electrode of said second transistor and the other of said input terminals; and a third capacitor connected across said pair of input terminals.

References Cited in the file of this patent

UNITED STATES PATENTS

| | | |
|---|---|---|
| 2,755,384 | Pierson et al. | July 17, 1956 |
| 2,764,643 | Sulzer | Sept. 25, 1956 |
| 2,764,687 | Buchanan et al. | Sept. 25, 1956 |
| 2,825,810 | Zeidler | Mar. 4, 1958 |
| 2,844,795 | Herring | July 22, 1958 |

OTHER REFERENCES

"The Gerber Crystal Reactance System" by Brown et al. in CQ magazine, Oct. 1948 pp. 37, 38, 100, 101.